United States Patent
Zheng et al.

(10) Patent No.: US 10,692,920 B2
(45) Date of Patent: Jun. 23, 2020

(54) INTEGRATED CIRCUITS WITH IMAGE SENSORS AND METHODS FOR PRODUCING THE SAME

(71) Applicant: Globalfoundries Singapore Pte. Ltd., Singapore (SG)

(72) Inventors: Ping Zheng, Singapore (SG); Eng Huat Toh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/193,059

(22) Filed: Nov. 16, 2018

(65) Prior Publication Data
US 2020/0161365 A1 May 21, 2020

(51) Int. Cl.
*H01L 27/146* (2006.01)
(52) U.S. Cl.
CPC .. *H01L 27/14645* (2013.01); *H01L 27/14609* (2013.01); *H01L 27/14636* (2013.01); *H01L 27/14685* (2013.01)
(58) Field of Classification Search
CPC ......... H01L 27/14685; H01L 27/14609; H01L 27/14636; H01L 27/14645
See application file for complete search history.

(56) References Cited

U.S. PATENT DOCUMENTS

| | | | |
|---|---|---|---|
| 8,003,425 B2* | 8/2011 | Adkisson | H01L 27/14618 257/436 |
| 8,049,256 B2* | 11/2011 | Guidash | H01L 27/14634 257/292 |
| 8,072,006 B1 | 12/2011 | Hackier, Sr. et al. | |
| 8,587,040 B2* | 11/2013 | Kobayashi | H04N 5/374 257/291 |
| 9,923,006 B2* | 3/2018 | Watanabe | H01L 31/101 |
| 2013/0056809 A1* | 3/2013 | Mao | H01L 27/14614 257/292 |
| 2019/0237499 A1* | 8/2019 | Roy | H01L 27/14614 |

OTHER PUBLICATIONS

Grenouillet et al.; "Smart Co-Integration of Light Sensitive Layers with FDSOI Transistors for More than Moore Applications", IEEE, 2014, two pages.
Park et al., "A Study of Vertical THin Poly-Si Channel Transfer Gate Structured CMS Image Sensors", IEEE Electron Device Letters, Feb. 2017, pp. 232-235, vol. 38, No. 2.

* cited by examiner

*Primary Examiner* — William Coleman
(74) *Attorney, Agent, or Firm* — Thompson Hine LLP

(57) ABSTRACT

Integrated circuits and methods of producing the same are provided. In an exemplary embodiment, an integrated circuit includes a photodetector, where the photodetector includes an impingement photodetector well and a base photodetector well. A transfer transistor overlies the photodetector, where the transfer transistor includes a transfer gate, a source, and a drain. A source contact is electrically connected to the source, and the source contact is also electrically connected to the photodetector.

19 Claims, 7 Drawing Sheets

INTEGRATED CIRCUITS WITH IMAGE SENSORS AND METHODS FOR PRODUCING THE SAME

TECHNICAL FIELD

The technical field generally relates to integrated circuits with image sensors and methods of producing the same, and more particularly relates to integrated circuits with image sensors having reduced surface areas, and methods of producing the same.

BACKGROUND

Integrated circuits with image sensors are utilized in a wide variety of technologies. Impinging a photodetector with an electromagnetic radiation source, such as light, produces an electrical current in the photodetector. This electrical current produced in the photodetector can then be amplified and transmitted, and an array of the photodetectors can be used to produce an image. This technology often utilizes a plurality of image sensors, where each image sensor serves as a pixel in an image. Each image sensor that forms a pixel has typically included a photodiode, a transfer gate, and a reset gate. However, the photodiode, the transfer gate, and the reset gate compete for space on an integrated circuit. Scaling the image sensor to smaller sizes tends to reduce the area of photodiodes to sizes that result in reduced voltage, increased noise level, and reduced overall performance.

Image sensors are often utilized to detect electromagnetic radiation in the visible region of about 380-740 nanometers (nm). Pixel size scaling risks insufficient full well capacity (FWC) of the photo diode due to reduced capacitance of the photo diode, and consequently sensor performance degradation. Examples of sensor performance degradation include, but are not limited to, a reduced signal to noise ratio, decreased dynamic range, and other performance issues.

Accordingly, it is desirable to provide integrated circuits with image sensors that allow for reduced overall size as compared to existing image sensors, and methods of producing the same. In addition, it is desirable to provide integrated circuits with image sensors having reduced surface area with sufficient full well capacity of the photo diode for efficient detection of visible light. Furthermore, other desirable features and characteristics of the present embodiments will become apparent from the subsequent detailed description and the appended claims, taken in conjunction with the accompanying drawings and this background.

BRIEF SUMMARY

Integrated circuits and methods of producing the same are provided. In an exemplary embodiment, an integrated circuit includes a photodetector, where the photodetector includes an impingement photodetector well and a base photodetector well. A transfer transistor overlies the photodetector, where the transfer transistor includes a transfer gate, a source, and a drain. A source contact is electrically connected to the source, and the source contact is also electrically connected to the photodetector.

An integrated circuit is provided in another exemplary embodiment. The integrated circuit includes a photodetector, where the photodetector includes an impingement photodetector well and a base photodetector well. A buried insulator overlies the photodetector. A pixel circuit overlies the buried insulator, where the pixel circuit includes all transistors that are dedicated to one photodetector. The pixel circuit includes a single transistor.

A method of producing an integrated circuit is provided in yet another embodiment. The method includes forming a photodetector that includes an impingement photodetector well and a base photodetector well. A transfer transistor is formed overlying a buried insulator, where the buried insulator overlies the photodetector. The transfer transistor includes a transfer gate, a source and a drain. A source contact is formed, where the source contact is electrically connected to the source and also to the base photodetector well.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and processes described herein may be incorporated into a more comprehensive procedure having additional processes or functionality not described in detail herein. In particular, various processes in the manufacture of integrated circuits are well-known and so, in the interest of brevity, many conventional processes will only be mentioned briefly herein or will be omitted entirely without providing the well-known process details.

An integrated circuit includes an image sensor, where the image sensor includes a transfer transistor overlying a buried insulator, and a photodetector underlying the buried insulator. The photodetector includes a P/N junction formed between and by an impingement photodetector well and a base photodetector well. The transfer transistor includes a source and a drain, and an electrically conductive contact is electrically connected with the source and also with the base photodetector well. The size of the photodetector is not limited by the transfer transistor, because the photodetector and transfer transistor are on opposite sides of the buried insulator, and the electrical connection between the source and the base photodetector well eliminates the need for a reset transistor dedicated to each image sensor.

Figure 1:
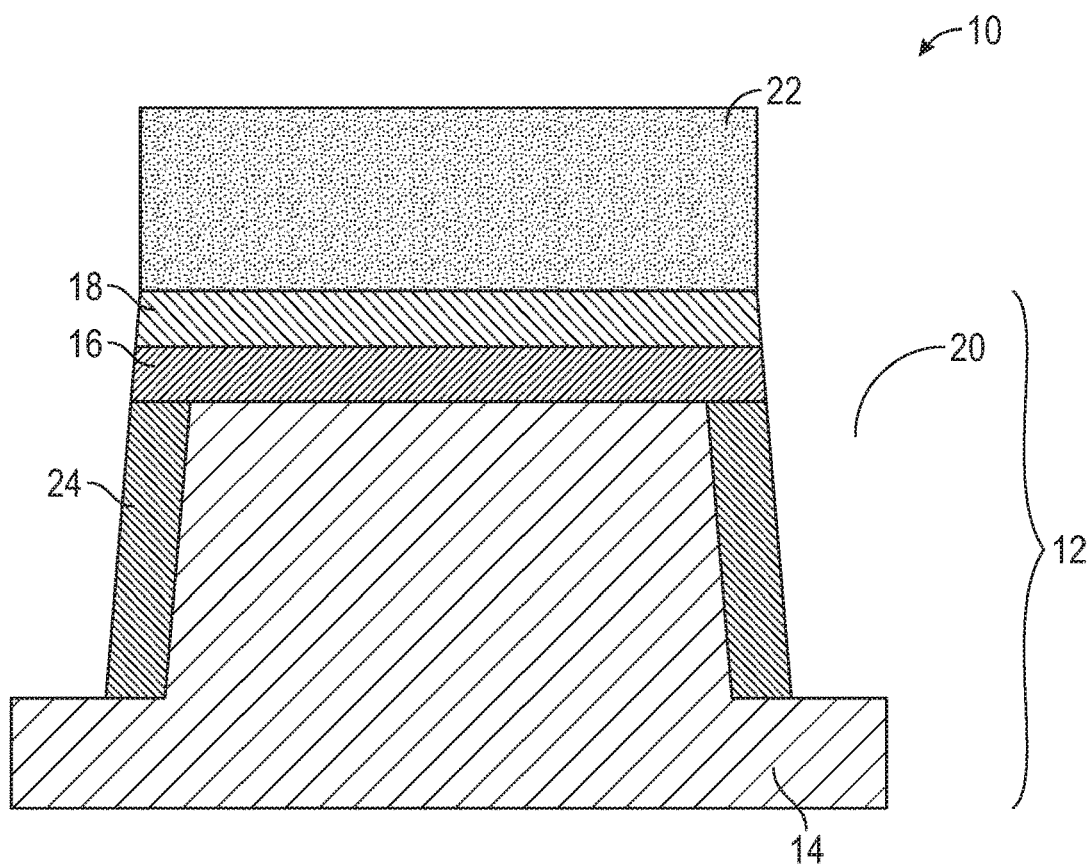
FIGS. 1-9 are cross sectional views of embodiments of an integrated circuit, and methods for producing the same.

Reference is made to an exemplary embodiment of an integrated circuit and a method of producing the same as illustrated in FIGS. 1-7. Referring to FIG. 1, an integrated circuit 10 includes a substrate 12, where the substrate 12 may be a silicon on insulator substrate (SOI substrate) 12. The SOI substrate 12 includes a handle layer 14, a buried insulator 16 overlying the handle layer 14, and an active layer 18 overlying the buried insulator 16. As used herein, the term "overlying" means "over" such that an intervening layer may lie between the overlying component (the active layer 18 in this example) and the underlying component (the buried insulator 16 in this example,) or "on" such that the overlying component physically contacts the underlying component. Moreover, the term "overlying" means a vertical line passing through the overlying component also passes through the underlying component, such that at least a portion of the overlying component is directly over at least a portion of the underlying component. It is understood that the integrated circuit 10 may be moved such that the relative "up" and "down" positions change, and the integrated circuit 10 can be operated in any orientation. Spatially relative terms, such as "top", "bottom", "over" and "under" are made in the context of the orientation of the cross-sectional FIG. 1. It is to be understood that spatially relative terms refer to the orientation in the figures, so if the integrated circuit 10 were to be oriented in another manner the spatially relative terms would still refer to the orientation depicted in the figures. Thus, the exemplary terms "over" and "under" remain the same even if the device is twisted, flipped, or otherwise oriented other than as depicted in the figures.

As used herein, the term "substrate materials" will be used to encompass semiconductor materials conventionally used in the semiconductor industry to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the active layer 18 is a monocrystalline silicon material, but other substrate materials may be used in alternate embodiments. The buried insulator 16 is silicon dioxide in an exemplary embodiment, but sapphire or other insulating materials may also be used. As used herein, an "electrically insulating material" is a material with a resistivity of about $1 \times 10^4$ ohm meters or more, an "electrically conductive material" is a material with a resistivity of about $1 \times 10^4$ ohm meters or less, and an "electrically semiconductive material" is a material with a resistivity of from about more than $1 \times 10^4$ ohm meters to less than about $1 \times 10^4$ ohm meters. The handle layer 14 provides mechanical strength and stability to the SOI substrate 12, and is monocrystalline silicon in an exemplary embodiment. However, a wide variety of other materials that provide mechanical strength and stability may be used in alternate embodiments.

An isolation trench 20 is formed in the substrate 12 for an isolation structure. The isolation trench 20 can be formed by any suitable technique. In an exemplary embodiment, an isolation photoresist layer 22 is deposited overlying the substrate 12, and patterned for the positions of the desired isolation structures. The isolation photoresist layer 22 (and other photoresist layers described below) may be deposited by spin coating, and patterned by exposure to light or other electromagnetic radiation through a mask with transparent sections and opaque sections. The light causes a chemical change in the photoresist such that either the exposed portion or the non-exposed portion can be selectively removed. The desired locations may be removed with an organic solvent, and the isolation photoresist layer 22 remains overlying the other areas of the substrate 12. The isolation photoresist layer 22 (and other photoresist layers described below) may optionally include a top and/or bottom anti-reflective coating and/or a hard mask (not illustrated). Many anti-reflective coatings are available, including inorganic and organic compounds, such as titanium nitride or organosiloxanes. Titanium nitride may be deposited by chemical vapor deposition using tetramethylamidotitanium and nitrogen trifluoride, and organosiloxanes may be deposited by spin coating. Anti-reflective coatings may improve the accuracy and critical dimensions during photoresist patterning. Silicon nitride may be used as a hard mask, where silicon nitride can be formed by low pressure chemical vapor deposition using ammonia and dichlorosilane. The isolation trench 20 is then anisotropically etched through the isolation photoresist layer 22 and into the substrate 12, such as by reactive ion etch with silicon hexafluoride. In an exemplary embodiment, the isolation trench 20 passes through the active layer 18 and the buried insulator 16, and extends for some distance into the handle layer 14. The isolation trench 20 extends into the substrate 12 to a desired depth that is sufficient to electrically isolate adjacent sections of the substrate 12 for different purposes. The isolation photoresist layer 22 may then be removed, such as with an oxygen containing plasma.

A pinning region 24 may optionally be formed along a side wall of the isolation trench 20. The pinning region 24 may be formed with a tilt implant, where the substrate 12 is tilted relative to a source of implantation ions such that the implantation ions impact the handle layer 14 of the substrate 12 along the side wall of the isolation trench 20. In an exemplary embodiment, the optional pinning region 24 is formed by implanting "P" type conductivity determining impurities (i.e. dopants) as ions into the side wall of the handle layer 14. "P" type conductivity determining impurities typically include boron, aluminum, gallium, and indium, but other materials could also be used. "N" type conductivity determining impurities typically include phosphorous, arsenic, and/or antimony, but other materials could also be used. Ion implantation may involve ionizing the conductivity determining impurity and propelling the ions into the substrate 12 under the influence of an electrical field. The pinning region 24 may then annealed to repair crystal damage from the ion implantation process, to electrically activate the conductivity determining impurities, and to redistribute the conductivity determining impurities within the semiconductor material. The annealing process can use widely varying temperatures, such as temperatures ranging from about 500 degrees centigrade (° C.) to about 1,200° C. The annealing process may be performed immediately after ion implantation, or at a later time that is convenient for the manufacturing process. In some embodiments a single anneal is utilized for multiple different implants, so the anneal for the pinning region 24 is often also the anneal for other areas or components that have been implanted with conductivity determining impurities.

Figure 2:
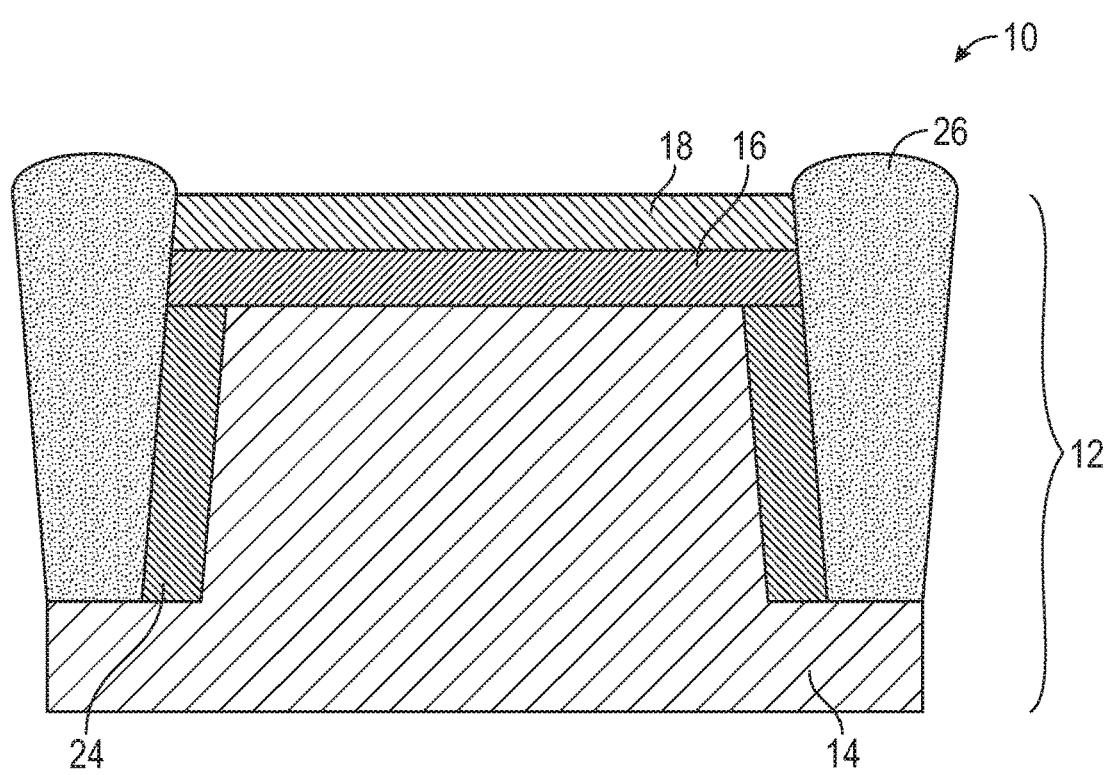

Referring to an exemplary embodiment illustrated in FIG. 2, with continuing reference to FIG. 1, isolation structures 26 are formed within the substrate 12. The isolation trench 20 may be filled with an electrically insulating material, such as silicon dioxide, which may be deposited by chemical vapor deposition using silane and oxygen.

Overburden may then be removed, such as by chemical mechanical planarization to produce the isolation structure 26. Electrically insulating materials other than silicon dioxide may be utilized in alternate embodiments, and alternate deposition techniques may also be utilized. The optional pinning region 24 remains within the handle layer 14 adjacent to the isolation structure 26.

Figure 3:
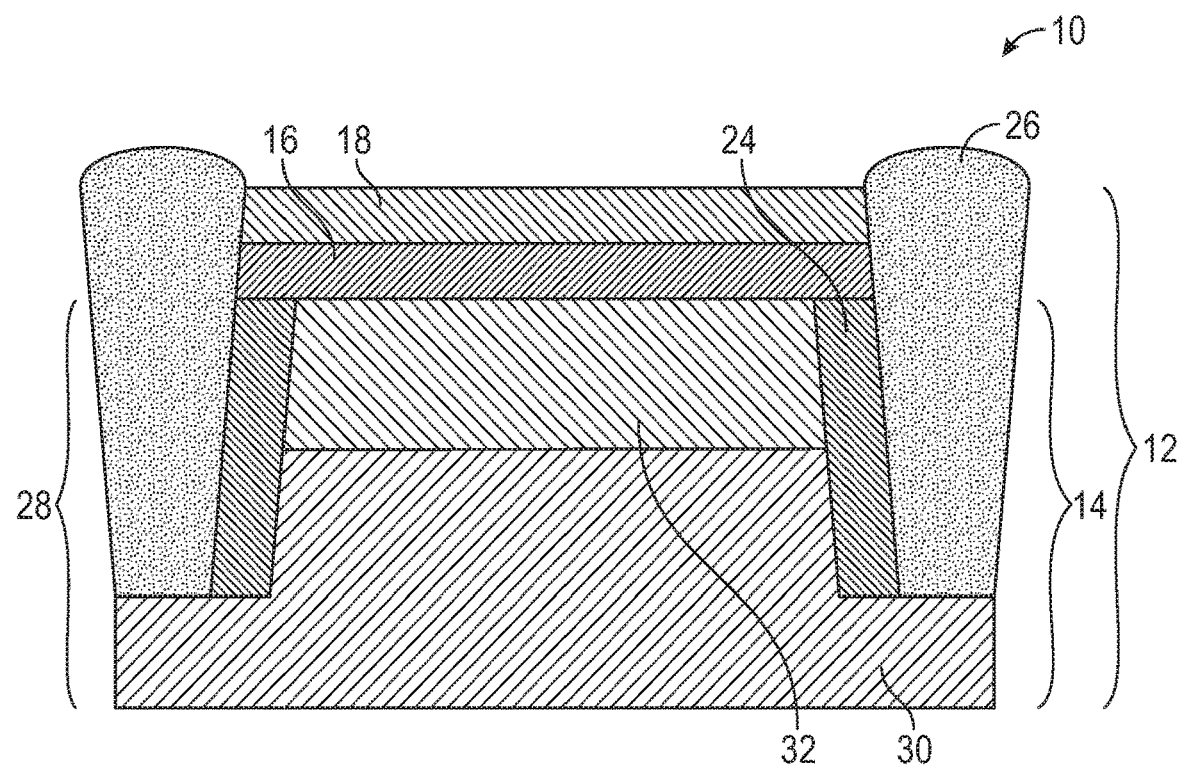

An impingement photodetector well 30 and a base photodetector well 32 are formed in the handle layer 14, as illustrated in an exemplary embodiment in FIG. 3. The impingement photodetector well 30 and base photodetector well 32 may be formed by ion implantation, as described above, where the ion implantation energy is adjusted to implant the ions at the desired depth within the substrate 12. The ions may be implanted through the active layer 18 and the buried insulator 16 in an exemplary embodiment, but it is also possible to implant the ions through a bottom surface of the handle layer 14 such that the ions do not pass through the active layer 18 and buried insulator 16 en route to the handle layer 14. The base photodetector well 32 overlies the impingement photodetector well 30, and the base photodetector well 32 may be adjacent to one or more of the isolation structures 26. In an exemplary embodiment, the base photodetector well 32 about fills the space between two adjacent isolation structures 26, which maximizes the size of the base photodetector well 32 for a pixel that is defined between adjacent isolation structures 26. The impingement photodetector well 30 may have a surface area that is at least as large as a surface area of the base photodetector well 32, where the referenced surface areas of the base and impingement photodetector wells 32, 30 are parallel to each other and to a bottom plane of the buried insulator 16. The pinning region 24 may be positioned and defined between the isolation structure 26 and the adjacent base photodetector well 32.

The impingement photodetector well 30 and the base photodetector well 32 primarily include different types of conductivity determining impurities, so the interface produces a P/N junction. The impingement photodetector well 30 and the base photodetector well 32, which includes the P/N junction therebetween, form a photodetector 28. As such, the overall area of the photodetector 28 may be about the area defined between isolation structures 26, where the isolation structures 26 may about determine the surface area of the base and impingement photodetector wells 32, 30. The photodetector 28 may produce an electron flow when electromagnetic radiation such as light impinges on the impingement photodetector well 30. In an exemplary embodiment, the impingement photodetector well 30 primarily includes "P" type conductivity determining impurities, and the base photodetector well 32 primarily includes "N" type conductivity determining impurities, but the reverse is possible in alternate embodiments. A component "primarily" includes one type of conductivity determining impurity if that component includes more of the primary type of conductivity determining impurity than the opposite. The pinning region 24 primarily includes the same type of conductivity determining impurity as the impingement photodetector well 30. In an exemplary embodiment, the impingement and base photodetector wells 30, 32 have a conductivity determining impurity concentration of from about $10^{15}$ to about $10^{17}$ atoms per cubic centimeter ($cm^3$), but other concentrations are also possible. The pinning region 24 may have a comparable or higher conductivity determining impurity concentration than the impingement photodetector well 30 in some embodiments.

Figure 4:
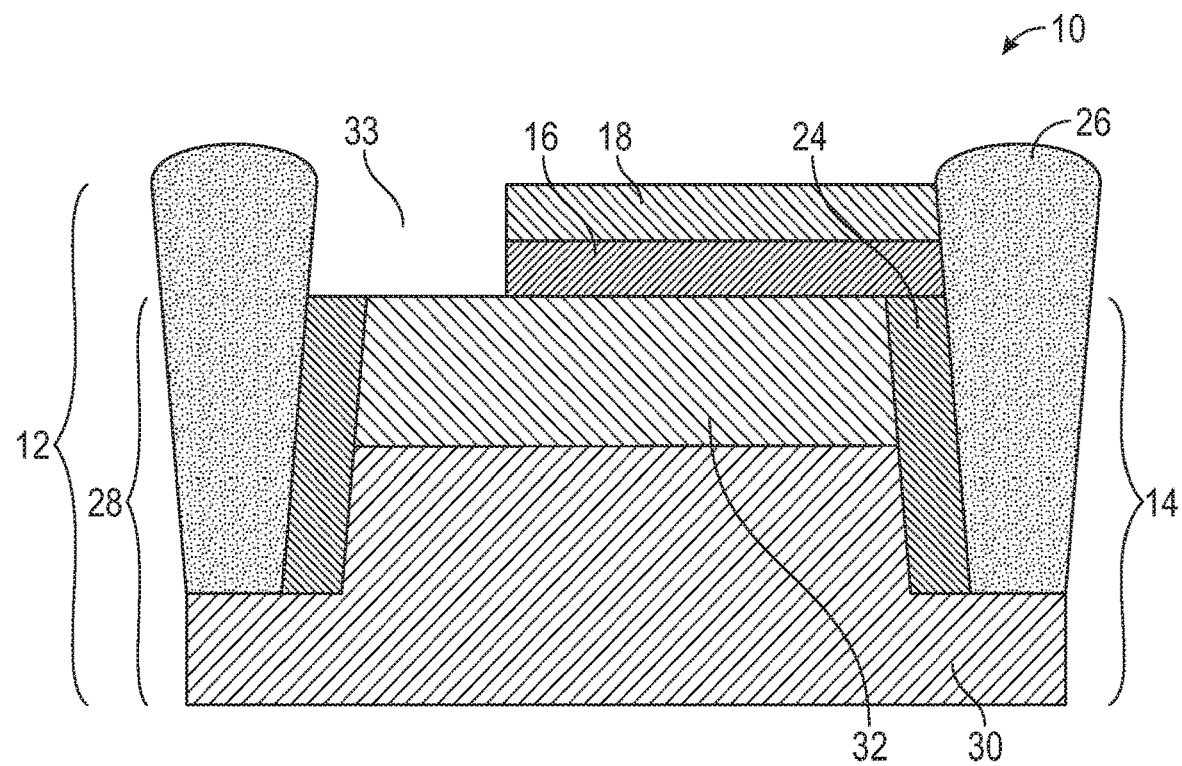

FIG. 4 illustrates an embodiment where a portion of the active layer 18 and the underlying buried insulator 16 are removed. The removed portions of the active layer 18 and the buried insulator 16 form a source contact gap 33 that may be adjacent to an isolation structure 26 in some embodiments. As such, the source contact gap 33 is free of the active layer 18 and also free of the buried insulator 16. The portions of the active layer 18 and the buried insulator 16 are removed with anisotropic etches in an exemplary embodiment, and the portions of the active layer 18 and the buried insulator 16 that remain may be lithographically protected from the etchants. In one exemplary embodiment, the active layer 18 is removed with a reactive ion etch using chlorine and hydrogen bromide, and the buried insulator 16 is removed with a reactive ion etch using carbon tetrafluoride, but many other etchants or etching techniques may be utilized in alternate embodiments. The source contact gap 33 exposes a portion of the base photodetector well 32.

Figure 5:
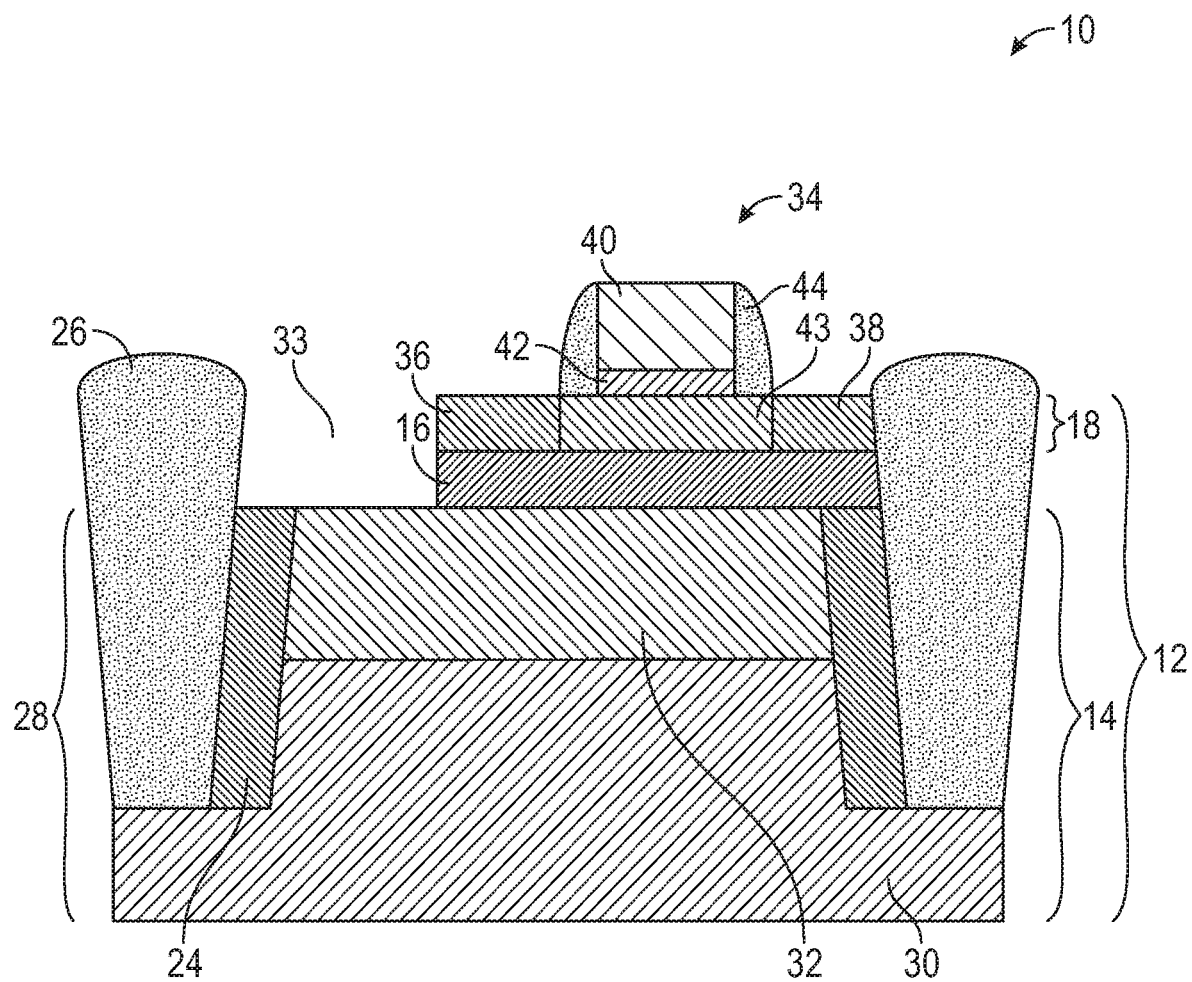

Reference is made to an exemplary embodiment in FIG. 5. A transfer transistor 34 is formed overlying the buried insulator 16. The transfer transistor 34 includes a source 36, a drain 38, a transfer gate 40, a transistor insulator 42, and a channel 43 that is a portion of the active layer 18 directly underlying the transfer gate 40 and between the source 36 and drain 38. The transfer transistor 34 overlies the photodetector 28 and the buried insulator 16, and the transfer transistor 34 and the photodetector 28 are on opposite sides of the buried insulator 16 such that the buried insulator 16 is between the photodetector 28 and the transfer transistor 34. The transfer transistor 34 may be formed using standard techniques, and may include optional spacers 44, optional extensions on the source 36 and drain 38 (not illustrated), and other components in various embodiments. The transfer transistor 34 may be formed by depositing an insulating layer followed by a gate layer (not individually illustrated), and then lithographically removing portions of the insulating and gate layer to form the transistor insulator 42 and the transfer gate 40. The source and drain extensions (not illustrated) may be implanted, and the spacers 44 may be formed by blanket depositing a spacer layer (not individually illustrated) and then anisotropically removing the bulk of the spacer layer to leave the spacers 44 adjacent to the transfer gate 40. The source 36 and drain 38 may then be formed by implanting conductivity determining impurities into the active layer 18.

In an exemplary embodiment, the source 36 and the drain 38 primarily include the same type of conductivity determining impurity as the base photodetector well 32. So, for example, if the base photodetector well 32 primarily includes "N" type conductivity determining impurities, the source 36 and drain 38 also primarily include "N" type conductivity determining impurities. Many variations of the transfer transistor manufacturing process are possible. The transistor insulator 42 and the spacers 44 are electrical insulators, and the transfer gate 40, the source 36, and the drain 38 are electrical conductors in an exemplary embodiment. The source 36 of the transfer transistor 34 may extend to a point directly adjacent to the source contact gap 33, such that there is no active layer 18 independent of the source 36 that is positioned between the source 36 and the source contact gap 33. The source contact gap 33 may be defined between the source 36 and one of the isolation structures 26 in some embodiments. In some embodiments, the source 36 extends to the edge of the active layer 18 adjacent the source contact gap 33, so the source 36 may terminate at the location where the active layer 18 and the buried insulator 16 were removed to form the source contact gap 33, as previously illustrated in FIG. 4.

Figure 6:
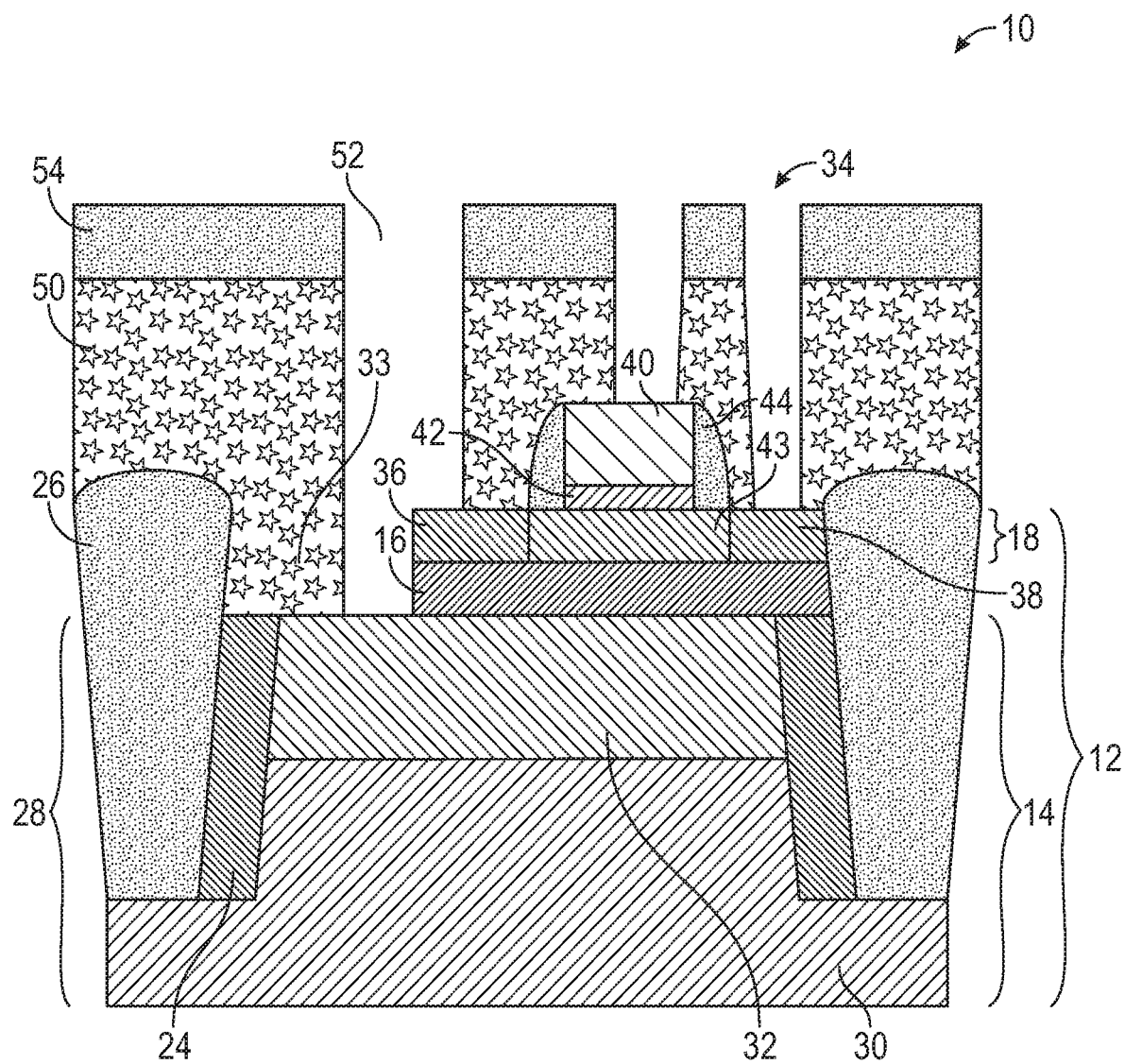

An interlayer dielectric layer 50 is formed overlying the substrate 12 and the transfer transistor 34, as well as within the source contact gap 33, as illustrated in an exemplary embodiment in FIG. 6 with continuing reference to FIG. 5. The source contact gap 33 is filled with material from the interlayer dielectric layer 50 or other materials, but the area is still referred to as the source contact gap 33 in this disclosure to better explain the integrated circuit 10. The interlayer dielectric layer 50 may include a wide variety of electrically insulating materials in various embodiments. For example, un-doped silicate glass (USG), silicon nitride, silicon oxynitride, silicon dioxide, low K dielectric materials, or combinations thereof may be used. In an exemplary embodiment, silicon dioxide is deposited by chemical vapor deposition using silane and oxygen, but other techniques and/or materials are utilized in alternate embodiments. A plurality of vias 52 may then be formed in the interlayer dielectric layer 50 using a via photoresist layer 54. In an exemplary embodiment, different vias 52 extend to a top surface of (i) the transfer gate 40, (ii) the drain 38, and (iii) the source 36. The via 52 that extends to the source 36 also extends to a top surface of the base photodetector well 32 through the source contact gap 33. The vias 52 may be produced with a reactive ion etch using carbon tetrafluoride in an exemplary embodiment, but many different etchants or etch techniques may be utilized in alternate embodiments. The via photoresist layer 54 is removed after use.

Figure 7:
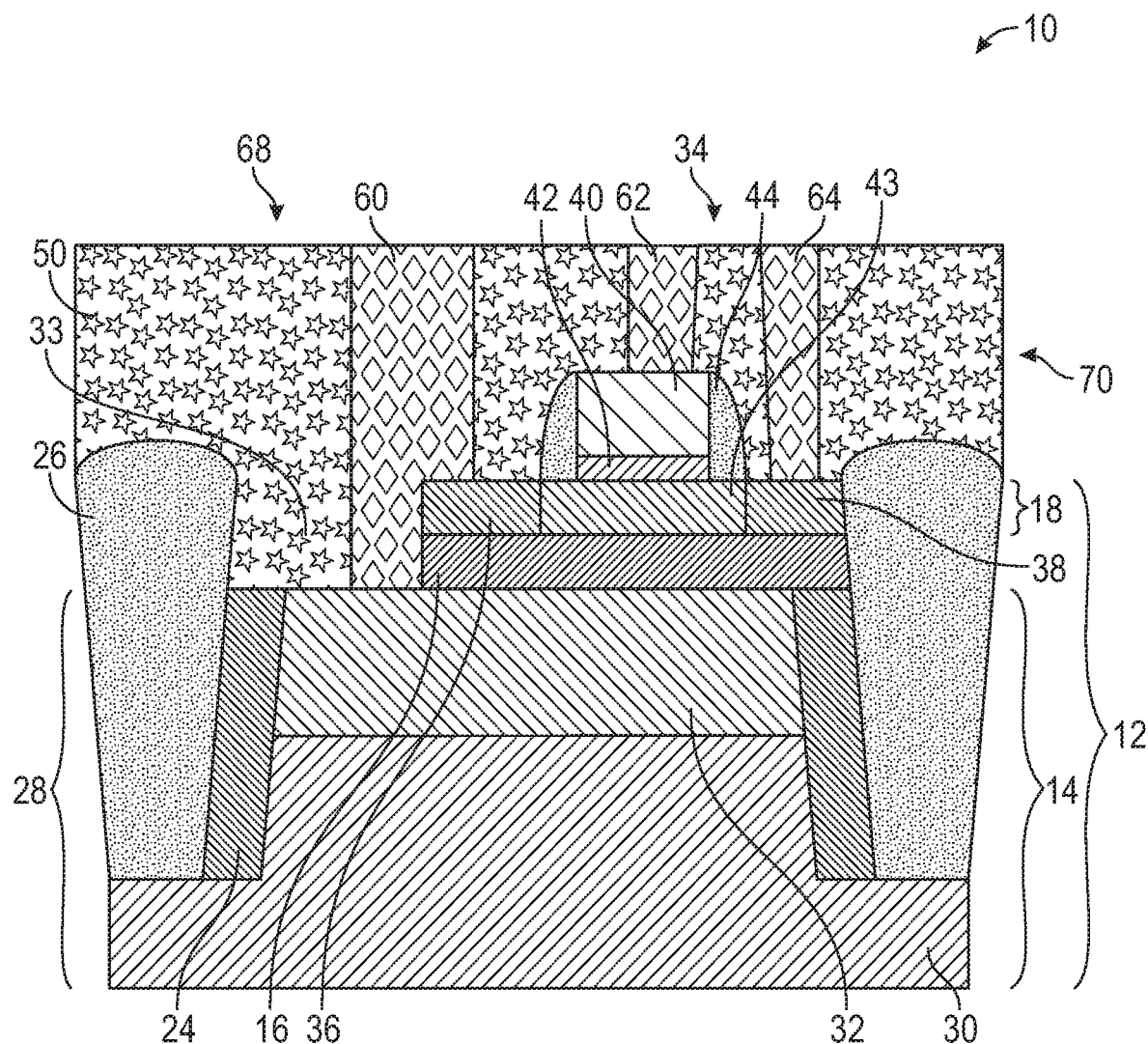

A plurality of contacts are formed within the vias 52, as illustrated in an exemplary embodiment in FIG. 7 with continuing reference to FIG. 6. The contacts include a source contact 60, a transfer gate contact 62, and a drain contact 64, where the contacts are electrically conductive. In an exemplary embodiment, the contacts include an adhesion layer, a barrier layer, and a plug (not shown), which are sequentially deposited. For example, an adhesion layer of titanium may be formed by low pressure chemical vapor deposition of titanium pentachloride, a barrier layer of titanium nitride may be formed by chemical vapor deposition of titanium tetrabromide and ammonia, and a plug of tungsten may be formed by chemical vapor deposition of tungsten hexafluoride and hydrogen. Other types of contacts are also possible, such as copper or other conductive materials. Overburden may be removed after the contacts are formed, such as with chemical mechanical planarization.

The source contact 60 is electrically connected with the source 36 and with the base photodetector well 32. The term "electrically connected," as used herein, means electrical current is capable of flowing from one component to another, where the electrical current may or may not flow through an electrically conductive or semiconductive intervening component. The term "direct electrical contact," as used herein, means direct physical contact between components that are electrically conductive or semiconductors, but not electrical insulators. In an exemplary embodiment, the source contact 60 is in direct electrical contact with the source 36 and also with the base photodetector well 32, where a silicide layer formed on the surface of the source 36 and/or base photodetector well 32 is considered a portion of the source 36 and/or base photodetector well 32 for direct electrical contact. The source contact 60 extends through the source contact gap 33 to electrically connect with the base photodetector well 32 of the photodetector 28. As such, in an exemplary embodiment the source contact 60 is in direct contact with a side surface of the buried insulator 16, and also in direct contact with a side surface of the source 36.

The base photodetector well 32 and the impingement photodetector well 30 form a P/N junction for the photodetector 28, as described above. An image sensor 68 includes the photodetector 28 and the transfer transistor 34. The impingement photodetector well 30 may be exposed to a source of light, such that light or other electromagnetic radiation impinges on the impingement photodetector well 30 and produces an electron flow within the photodetector 28. The photodetector 28 may be reset using a bias introduced to the handle layer 14, so a plurality of photodetectors 28 from different image sensors 68 may be reset at the same time. The image sensor 68 includes a pixel circuit 70, where the pixel circuit 70 includes all the transistors that are dedicated to one photodetector 28 of one image sensor 68. A transistor is "dedicated" to one photodetector 28 if that transistor is configured so that it only functions in conjunction with the one photodetector 28. Because the photodetector 28 may be reset using a bias introduced to the handle layer 14, there is no reset transistor within the pixel circuit 70 that is dedicated to one image sensor 68. As such, that the pixel circuit 70 is free of a reset transistor. In an exemplary embodiment, the pixel circuit 70 only includes one transistor, and that is the transfer transistor 34.

The transfer transistor 34 of the image sensor 68 is on the opposite side of the buried insulator 16 from the photodetector 28, so there is no competition for surface area, or footprint area, between the transfer transistor 34 and the photodetector 28. As a result, the photodetector 28 may have an exposed bottom surface of the impingement photodetector well 30 that extends for about the full area defined by the isolation structures 26, as mentioned above. Furthermore, the handle layer 14 is typically thicker than the active layer 18, so the photodetector 28 is thicker than if it were formed in the active layer 18. The surface area and capacitance of an integrated photodetector 28 underlying the buried insulator 16 is not limited by an overlying transistor, because the transfer transistor 34 and the photodetector 28 are on opposite sides of the buried insulator 16. Consequently, the full well capacity and sensor performance are not reduced by a reduction of the surface area of the photodetector 28 that would be sacrificed if the transfer transistor 34 were to overlie a portion of the surface area of the photodetector 28 that receives light or other electromagnetic radiation.

Figure 8:
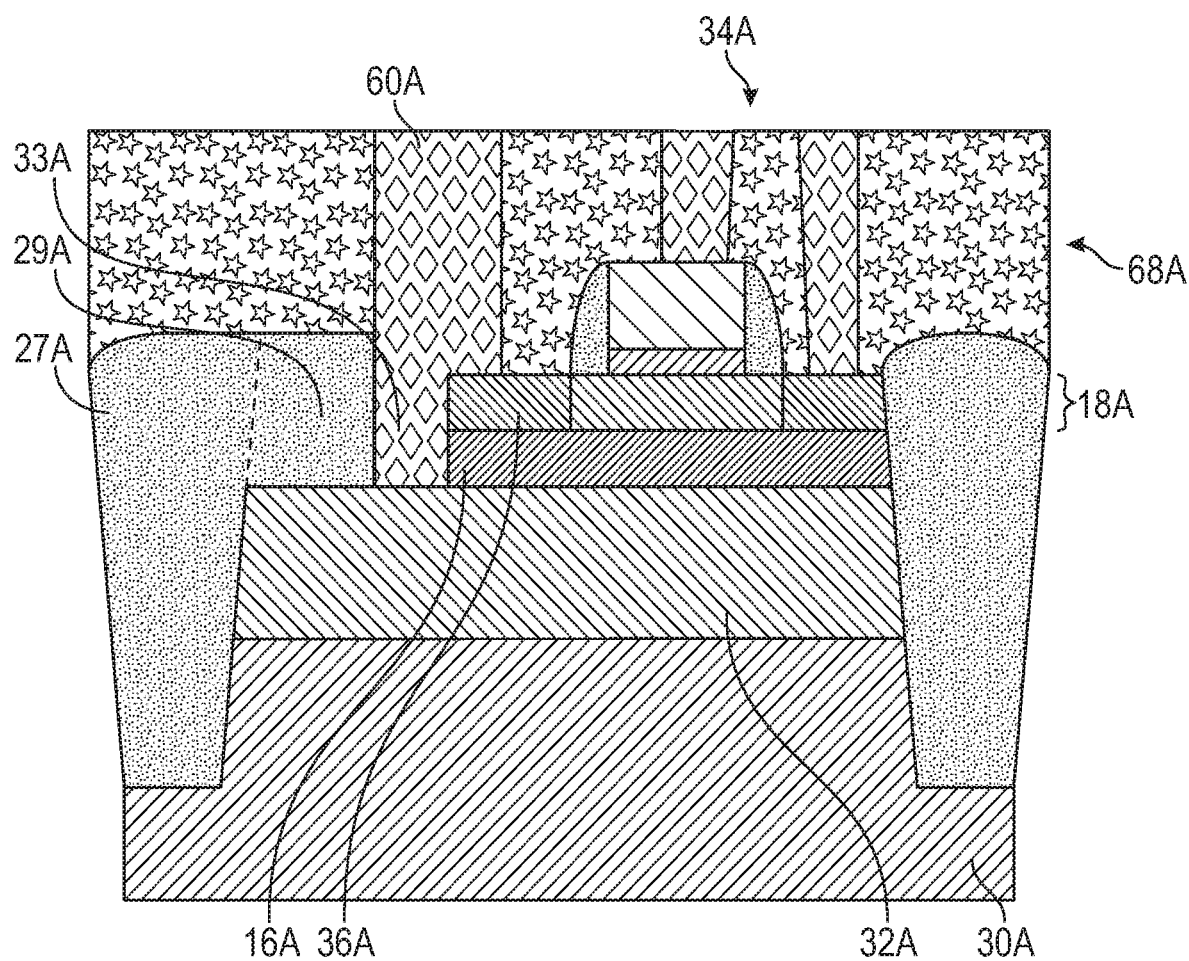

Many different embodiments of the image sensor are possible. In one exemplary embodiment, the image sensor 68A is formed with a deep isolation structure 27A and a shallow isolation structure 29A, as illustrated in an exemplary embodiment in FIG. 8. FIG. 8 includes a dashed line distinguishing the deep isolation structure 27A from the shallow isolation structure, but the deep and shallow isolation structures 27A, 29A may be one continuous material in an exemplary embodiment. The source contact gap 33A is positioned between the shallow isolation structure 29A and the source 36A of the transfer transistor 34A, and the shallow isolation structure 29A overlies a portion of the base photodetector well 32A and the impingement photodetector well 30A. The source contact gap 33A is also positioned between the shallow isolation structure 29A and the buried insulator 16A. The source contact 60A may extend to the base photodetector well 32A through the source contact gap 33A. In this embodiment, the source contact 60A directly contacts the shallow isolation structure 29A, but in alternate embodiments (not illustrated) the source contact may directly contact an isolation structure that does not include a shallow isolation structure. In the illustrated embodiment in FIG. 8, the optional pinning region is not included.

Figure 9:
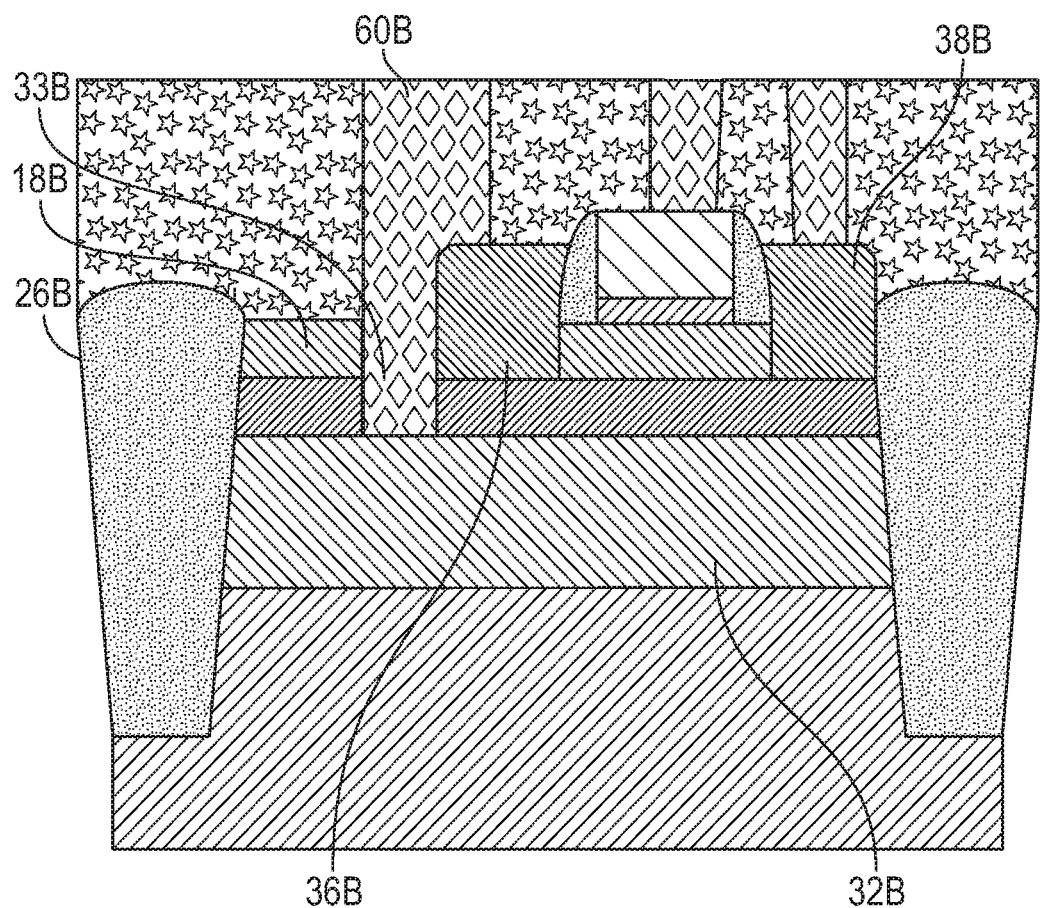

Another possible embodiment is illustrated in FIG. 9. In FIG. 9, the source 36B and drain 38B are increased in volume, such as with epitaxial growth. The source contact 60B extends through the source contact gap 33B to the base photodetector well 32B. In this embodiment, the source contact gap 33B is positioned between the source 36B and a portion of the active layer 18B that was not removed during formation of the source contact gap 33B, where that remaining portion of the active layer 18B is adjacent to an isolation structure 26B. In all embodiments, the source contact 60B is electrically connected with both the source 36B and the base photodetector well 32B.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way.

Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit comprising:
   a photodetector comprising an impingement photodetector well and a base photodetector well;
   a transfer transistor overlying the photodetector, wherein the transfer transistor comprises a transfer gate, a source, and a drain; and
   a source contact electrically connected to the source, wherein the source contact is also electrically connected to the photodetector.

2. The integrated circuit of claim 1 wherein the base photodetector well primarily comprises "N" type conductivity determining impurities, and wherein the impingement photodetector well primarily comprises "P" type conductivity determining impurities.

3. The integrated circuit of claim 1 further comprising two adjacent isolation structures, wherein the base photodetector well overlies the impingement photodetector well, and wherein the base photodetector well about fills a space between the two adjacent isolation structures.

4. The integrated circuit of claim 1 wherein the source contact is in direct electrical contact with the source, and wherein the source contact is in direct electrical contact with the photodetector.

5. The integrated circuit of claim 1 further comprising an isolation structure, wherein the base photodetector well is positioned adjacent to the isolation structure.

6. The integrated circuit of claim 1 wherein the source and the base photodetector well primarily include the same type of conductivity determining impurity.

7. The integrated circuit of claim 1 wherein the source contact is in direct electrical contact with the base photodetector well.

8. The integrated circuit of claim 1 further comprising a buried insulator positioned between the transfer transistor and the photodetector.

9. The integrated circuit of claim 1 further comprising:
   an isolation structure adjacent to the base photodetector well; and
   a source contact gap defined between the transfer transistor and the isolation structure.

10. The integrated circuit of claim 1 further comprising:
    a substrate, wherein the substrate comprises an active layer, a buried insulator, and a handle layer; and
    a source contact gap defined between the transfer transistor and a portion of the active layer, wherein the source contact gap is free of the buried insulator.

11. The integrated circuit of claim 5 further comprising a pinning region defined between the isolation structure and the photodetector.

12. The integrated circuit of claim 8 wherein the source contact is in direct contact with a side surface of the buried insulator, and wherein the source contact is in direct contact with a side surface of the source.

13. The integrated circuit of claim 9 wherein the source contact is positioned within the source contact gap.

14. The integrated circuit of claim 9 wherein the isolation structure comprises a deep isolation structure and a shallow isolation structure, wherein the shallow isolation structure overlies a portion of the base photodetector well.

15. An integrated circuit comprising:
    a photodetector comprising an impingement photodetector well and a base photodetector well;
    a buried insulator overlying the photodetector;
    a pixel circuit overlying the buried insulator, wherein the pixel circuit comprises a single transistor, the single transistor is a transfer transistor, the transfer transistor comprises a source, a transfer gate, and a drain,
    wherein the integrated circuit further comprises a source contact electrically connected to the source, and wherein the source contact is also electrically connected to the photodetector.

16. The integrated circuit of claim 15 wherein the source contact is in direct contact with the base photodetector well, and wherein the source contact is in direct contact with the source.

17. The integrated circuit of claim 15 wherein the source comprises conductivity determining impurities, the base photodetector well comprises conductivity determining impurities, and the source and the base photodetector well primarily include the same type of conductivity determining impurities.

18. The integrated circuit of claim 15 further comprising a plurality of isolation structures, wherein the base photodetector well overlies the impingement photodetector well, and wherein the base photodetector well is positioned between two of the plurality of isolation structures.

19. A method of producing an integrated circuit comprising:
    forming a photodetector comprising an impingement photodetector well and a base photodetector well;
    forming a transfer transistor overlying a buried insulator, wherein the buried insulator overlies the photodetector, and wherein the transfer transistor comprises a transfer gate, a source, and a drain; and
    forming a source contact electrically connected to the source and to the base photodetector well.

* * * * *